US012805006B2

(12) United States Patent
Demircan et al.

(10) Patent No.: US 12,805,006 B2
(45) Date of Patent: Nov. 17, 2026

(54) LATCH-UP PREVENTION WITH WELL-TIE EXTENSION USING SELECTIVE WELL DOPING

(71) Applicant: NXP B.V., Eindhoven (NL)

(72) Inventors: Ertugrul Demircan, Eugene, OR (US); Douglas Michael Reber, Austin, TX (US); Mehul D. Shroff, Austin, TX (US)

(73) Assignee: NXP B.V., Eindhoven (NL)

( * ) Notice: Subject to any disclaimer, the term of this patent is extended or adjusted under 35 U.S.C. 154(b) by 391 days.

(21) Appl. No.: 18/524,997

(22) Filed: Nov. 30, 2023

(65) Prior Publication Data

US 2025/0185360 A1 Jun. 5, 2025

(51) Int. Cl.

| | |
|---|---|
| ***H10D 84/85*** | (2025.01) |
| ***H10D 62/17*** | (2025.01) |
| ***H10D 84/01*** | (2025.01) |
| ***H10D 84/03*** | (2025.01) |

(52) U.S. Cl.

CPC ......... *H10D 84/854* (2025.01); *H10D 62/371* (2025.01); *H10D 84/0191* (2025.01); *H10D 84/038* (2025.01)

(58) Field of Classification Search

CPC ............. H10D 84/854; H10D 84/0191; H10D 84/038; H10D 62/371

See application file for complete search history.

(56) References Cited

U.S. PATENT DOCUMENTS

| | | | | |
|---|---|---|---|---|
| 4,762,802 | A | 8/1988 | Parrillo | |
| 5,441,900 | A | 8/1995 | Bulucea et al. | |
| 6,420,221 | B1 | 7/2002 | Lee et al. | |
| 7,777,248 | B1 * | 8/2010 | Boyd .................. | H10D 18/251 257/355 |
| 2002/0164848 | A1 * | 11/2002 | Lee .................... | H10D 84/0188 257/E21.642 |
| 2004/0075144 | A1 | 4/2004 | Zitouni et al. | |
| 2010/0109083 | A1 | 5/2010 | Kim et al. | |
| 2015/0364470 | A1 | 12/2015 | Yamaji | |
| 2022/0399437 | A1 | 12/2022 | Kim et al. | |

FOREIGN PATENT DOCUMENTS

| | | | |
|---|---|---|---|
| CN | 107946298 | A | 5/2020 |
| TW | I332698 | B | 11/2010 |
| WO | 2023077137 | A1 | 5/2023 |

* cited by examiner

*Primary Examiner* — Douglas M Menz

(57) ABSTRACT

A CMOS circuit including a substrate of a first conductivity type with an emitter of a second conductivity type formed on a surface of the substrate, a well tie of the first conductivity type formed between trigger regions and the emitter comprising a strip of heavier doping coupled to a supply-voltage reference, and a well-tie extension including a deep lateral implant of the first conductivity type that overlaps a portion of the well tie. The deep lateral implant may have a degenerate level of doping. The deep lateral implant may be extended to form a guard-ring surrounding the emitter. Also, a deep implant of the first conductivity type may be formed at a lower portion of a body of the substrate that overlaps at least a portion of a lower extent of the deep lateral implant. The well tie may be extended to form a deep-profile guard-ring surrounding the emitter.

18 Claims, 6 Drawing Sheets

LATCH-UP PREVENTION WITH WELL-TIE EXTENSION USING SELECTIVE WELL DOPING

BACKGROUND

Field

The present disclosure relates in general to integrated-circuit (IC) design, and more particularly to a system and method of improving latch-up immunity of IC circuitry with selective well doping.

Description of the Related Art

Latch-up is a critical failure mechanism of IC design caused by the creation of an inadvertent short-circuit through a feedback loop with parasitic bipolar-junction transistors (BJTs). Latch-up is typically caused by the presence of parasitic bipolar PNP and NPN transistors in the structure of PMOS and NMOS transistors of a complementary metal-oxide semiconductor (CMOS) IC. Under certain operating conditions, the parasitic bipolar devices may interact and cause a latched short-circuit condition from which the circuitry cannot recover without powering down and restarting the circuit. The latch-up condition usually interferes with and even prevents normal functionality, and the resultant high current caused by the short-circuit may generate significant heat that may damage or destroy the circuitry. Typical solutions to avoid latch-up are to follow conventional design rules that prevent the formation of the parasitic devices in close proximity, adding guard-rings to collect minority currents and strapping wells with supply taps.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

In this disclosure, a latch-up solution is described that uses selective implants for well ties to act as collector guards or guard-rings for parasitic emitters. Parasitic emitters form "hot zones" of injected current that may reach "trigger" regions causing latch-up. The increased dopant level of the selected implants increases recombination rates which reduce the injected current that reaches the trigger regions where latch-up might otherwise be triggered. The increased dopant level effectively creates a smaller hot zone around the parasitic emitters, thereby improving latch-up immunity as compared to conventional configurations.

The block diagrams are generic depictions of semiconductor-manufacturing formations that are not drawn to scale. Specific dimensions are not shown as they may vary among different CMOS technologies.

Figure 1:
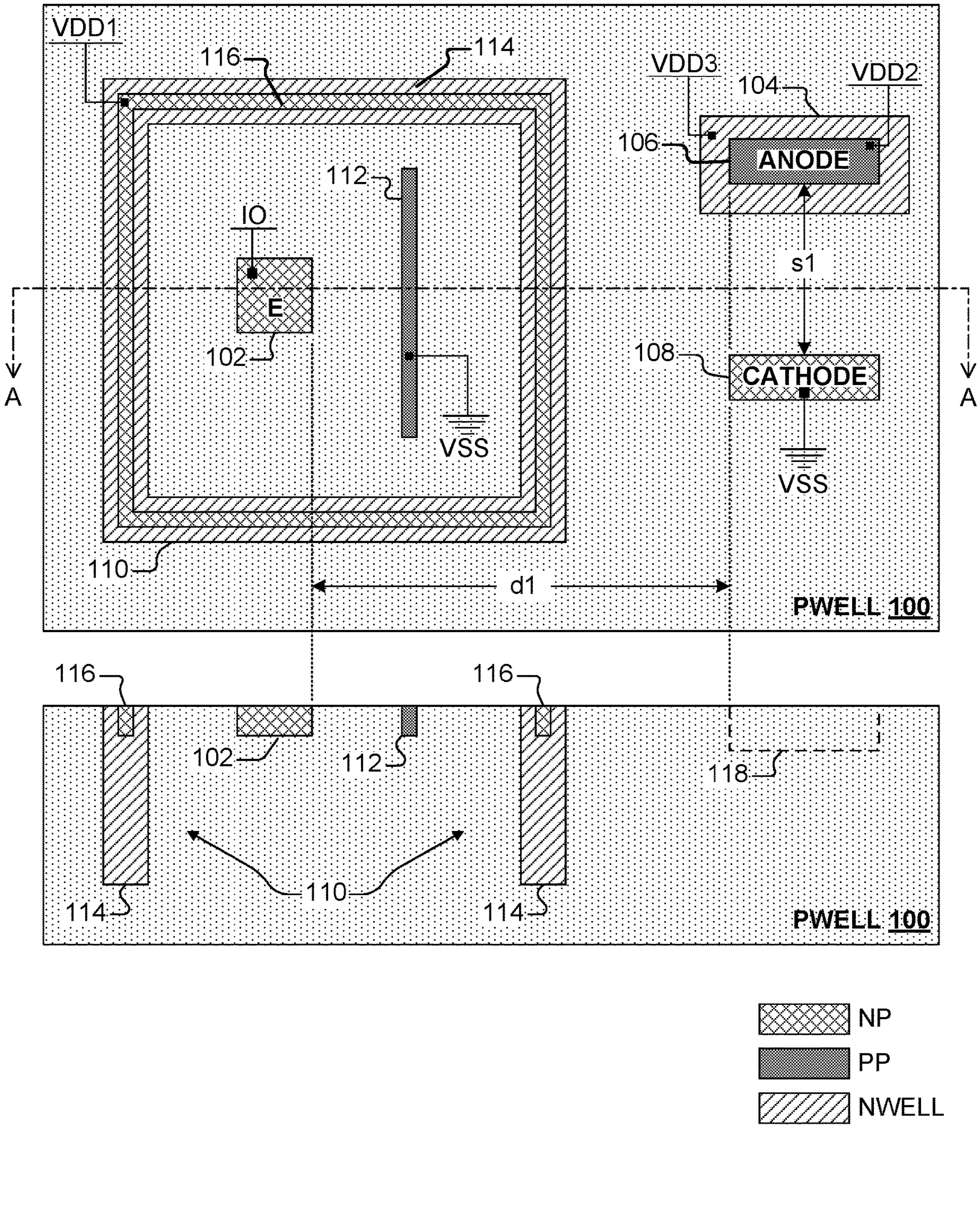
FIG. 1 (PRIOR ART)
FIG. 1 is a simplified block diagram of a top view and corresponding cross-sectional side view looking along line A-A of the top view of an exemplary portion of a CMOS P-type substrate (shown as PWELL) of an IC configured with a conventional latch-up protection scheme.

FIG. 1 is a simplified block diagram of a top view and corresponding cross-sectional side view looking along line A-A of the top view of an exemplary portion of a complementary metal-oxide semiconductor (CMOS) P-type substrate (shown as PWELL) 100 of an integrated-circuit (IC) configured with a conventional latch-up protection scheme. An N+ (NP) region 102 formed along the surface of the PWELL 100 is an active diffusion region that may operate as a parasitic EMITTER (E). A parasitic emitter, including, for example, the EMITTER E, forms a "hot zone" of injected current that may reach "trigger" regions within the hot zone causing latch-up. The NP region 102 is formed with a heavier N+ doping that may inject minority carriers into the PWELL 100 when energized by an input/output (I/O) signal applied to a corresponding I/O pin or pad of the IC. The NP region 102 may be provided, for example, to form a source or drain terminal of an NMOS transistor of underlying circuitry formed on the IC.

An N-type well (NWELL) 104 is also formed on the PWELL 100. Although not specifically shown, the NWELL 104 has a deep implant profile with a lighter doping level as compared to the NP region 102. The NWELL is coupled to a supply voltage VDD2, which is one of several different supply voltage nets VDD1, VDD2, VDD3, etc., supplying the IC. It is noted that the different supply voltage nets may have the same or different voltage levels. A P+ (PP) region 106 formed within the NWELL 104 is an active diffusion region that is formed with heavier P+ doping which may be provided, for example, to form a source or drain terminal of a PMOS transistor. Another NP region 108 formed along the surface of the PWELL 100 is another active diffusion region that is formed with heavier N+ doping which may be provided, for example, to form a source or drain terminal of another NMOS transistor. It is noted that the various implant regions may be formed by either a single implantation step or by multiple implantation steps. In the latter case, the steps form a chain of implants, which may be of different implant species, doses, or energies.

The PP region 106 may be a trigger region in that it may operate as a parasitic ANODE that could otherwise interact with the NP region 102 acting as a parasitic EMITTER, causing a latch-up condition. Similarly, the NP region 108 may be another trigger region that may operate as a parasitic CATHODE that could otherwise interact with the NP region 102 acting as a parasitic EMITTER causing a latch-up condition. In general, a relatively large area of the PWELL 100 surrounding the NP region 102 is a "hot zone" in which the NP region 102 may interact with trigger regions comprising other structures and formations within the hot zone to cause a latch-up condition. Thus, other structures and formations, such as parasitic ANODEs and CATHODEs and the like that may form potential trigger regions, should be located outside the hot zone of the NP region 102 to improve latch-up immunity by avoiding latch-up conditions.

In the illustrated conventional latch-up protection scheme, a guard-ring 110 is formed around the NP region 102 and a well tie 112 is formed near the NP region 102 within the guard-ring 110 to provide a level of latch-up prevention and reduce the size of the hot zone. The guard-ring 110 is formed by a rectangular- or square-shaped NWELL 114 surrounding the NP region 102 and a corresponding rectangular- or square-shaped NP region 116 formed within the NWELL 114 as shown. In a similar manner as previously described, the NWELL 114 has a deep implant profile with a lighter doping level as compared to the NP region 116, which has a shallower implant profile with a heavier doping level. The NP region 116 is coupled to the supply voltage VDD1. The well tie 112 may be formed as a strip of heavier P+ doping forming a PP region that is coupled to a supply-voltage reference, such as VSS or ground.

Although not specifically described herein, the guard-ring 110 and the well tie 112 are formed according to specific design constraints, including sizing and doping levels to achieve the desired level of latch-up protection. Even so, the PP region 106 potentially acting as the ANODE and the NP region 108 potentially acting as the CATHODE must still be separated from the NP region 102 by a minimum-distance d1 to avoid the propensity for latch-up. A phantom block 118 depicts the relative positioning of the ANODE and CATHODE in the cross-sectional side view. In addition, the PP region 106 and the NP region 108 must be separated from each other by a minimum-distance s1.

Figure 2:
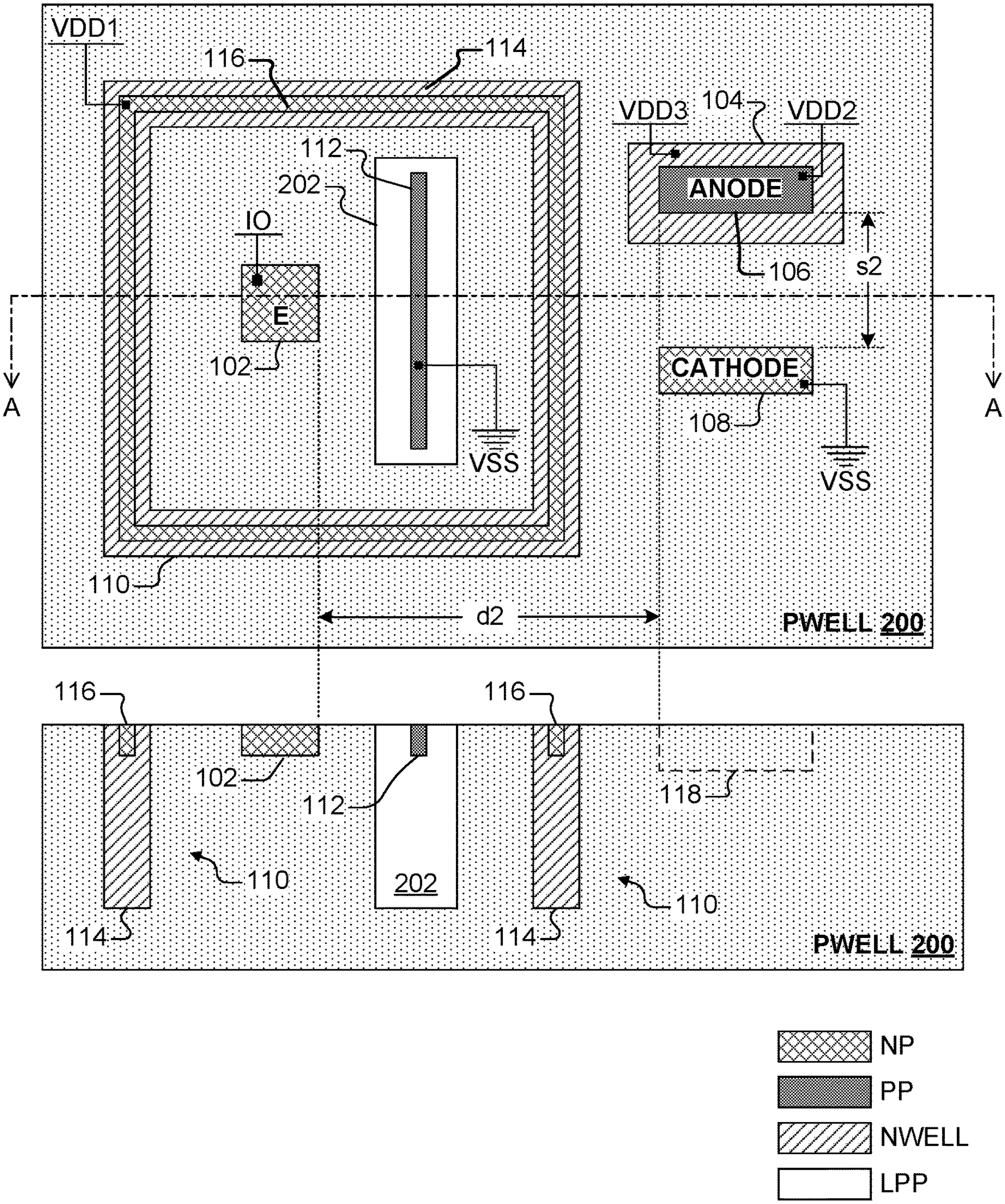
FIG. 2 is a simplified block diagram of a top view and corresponding cross-sectional side view looking along line A-A of the top view of an exemplary a portion of a CMOS P-type substrate (shown as PWELL) of an IC configured with latch-up protection implemented according to one embodiment.

FIG. 2 is a simplified block diagram of a top view and corresponding cross-sectional side view looking along line A-A of the top view of an exemplary a portion of a CMOS P-type substrate (shown as PWELL) 200 of an IC configured with latch-up protection implemented according to one embodiment. The PWELL 200 is fabricated with substantially similar formations as the PWELL 100, including the NP region 102 (EMITTER, E), the NWELL 104 including the PP region 106 (ANODE), the NP region 108 (CATHODE), the guard-ring 110 including the NWELL 114 and NP region 116, and the well tie 112. Again, the ANODE and CATHODE forming trigger regions should be located outside the hot zone formed by the EMITTER. The PWELL 200 further includes an application of a deep lateral PP (LPP) implant 202 with a degenerate level of doping to extend the well tie 112. Thus, the LPP implant 202 is a well-tie extension of the well tie 112 that reduces the propensity of latch-up. In one embodiment, the LPP implant 202 is around the well tie and overlaps at least a portion of the well tie 112 and has a deep implant profile similar to the NWELL 114. In another embodiment, the LPP implant 202 surrounds and encompasses the well tie 112 with a deep implant profile similar to the NWELL 114.

In one embodiment, the LPP implant 202 may be fabricated to be at about the same depth as the NWELL 114. In another embodiment, the LPP implant 202 has a peak at a greater depth than the peak of the NWELL 114. The depth of the NWELL 114 for conventional configurations is known and generally varies based on the technology. For bulk technologies at or below 28 nanometers (nm), for example, the depth of the NWELL 114 may in the range of 3000 to 5000 angstroms (Å). For Silicon-on-insulator (SOI) technologies, the depth may be shallower, such as in the range of 700-1500 Å. The depth of the LPP implant 202 may be at least as deep or deeper than the NWELL 114. The depth of the LPP implant 202 may be slightly deeper than the bottom of the isolation to ensure that there is no leakage path at the isolation corner.

It is appreciated that the PWELL 200 is configured with the guard-ring 110 and the well tie 112. The addition of the LPP implant 202, however, extends the well tie 112 to enable further relaxation of the minimum-distance requirements between the EMITTER (NP region 102) and the ANODE and CATHODE (the PP and NP regions 106 and 108, respectively), and between the ANODE and CATHODE. The increased dopant level by inclusion of the LPP implant 202 increases recombination rates which reduces the injected current from the EMITTER that reaches the latch-up trigger regions of the ANODE and CATHODE. In essence, the hot zone around the EMITTER is reduced by extending the well tie. Thus, the minimum-distance requirement from the EMITTER is reduced from the conventional distance d1 to a smaller distance d2, in which d2<d1. In addition, the addition of the LPP implant 202 enables relaxation of the minimum-distance requirement between the ANODE and CATHODE. The minimum-distance requirement between the ANODE and CATHODE is reduced from the conventional distance s1 to a smaller distance s2, in which s2<s1.

Figure 3:
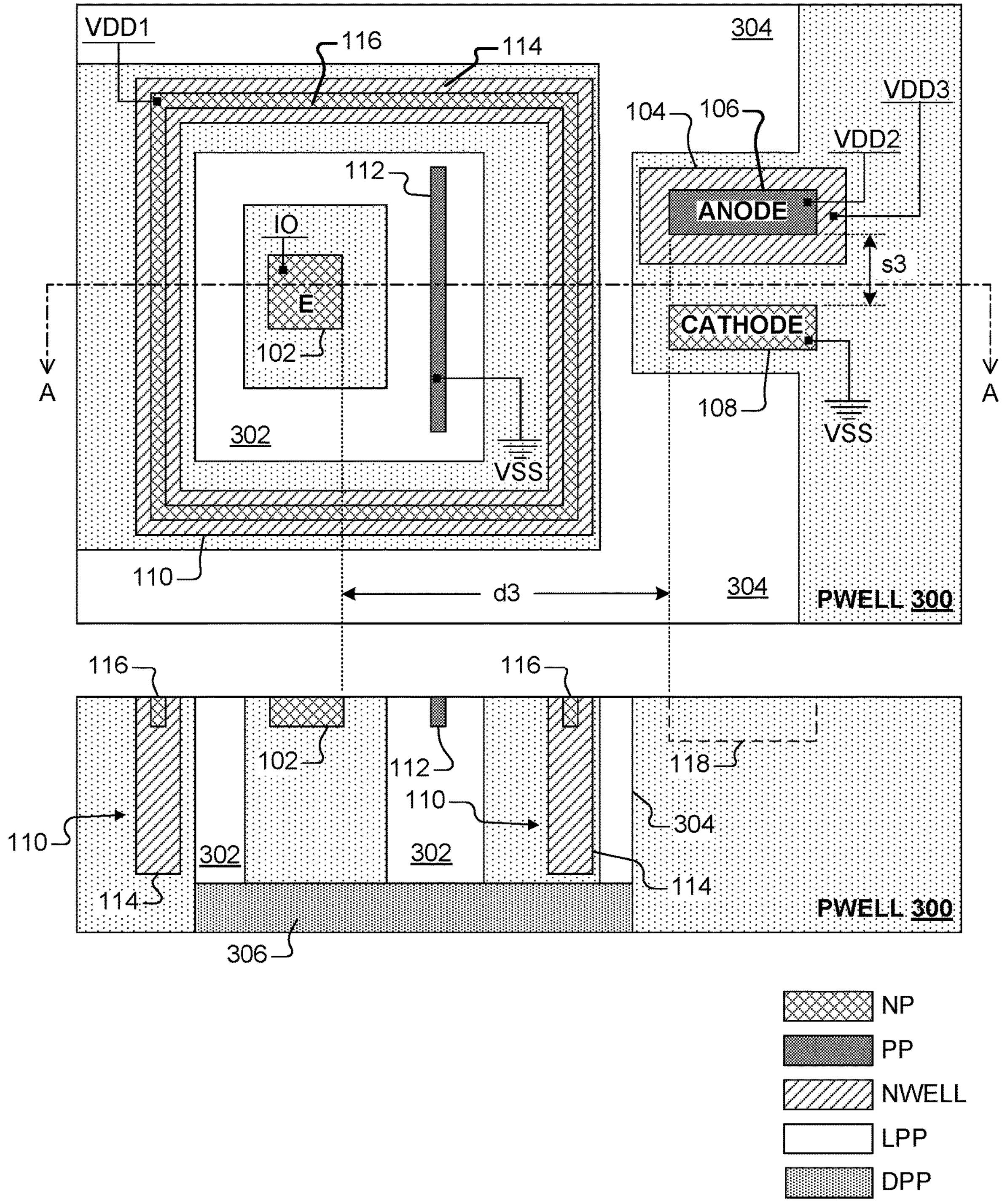
FIG. 3 is a simplified block diagram of a top view and corresponding cross-sectional side view looking along line A-A of the top view of an exemplary portion of a CMOS P-type substrate (shown as PWELL) 300 of an IC configured with latch-up protection implemented according to another embodiment.
Figure 4:
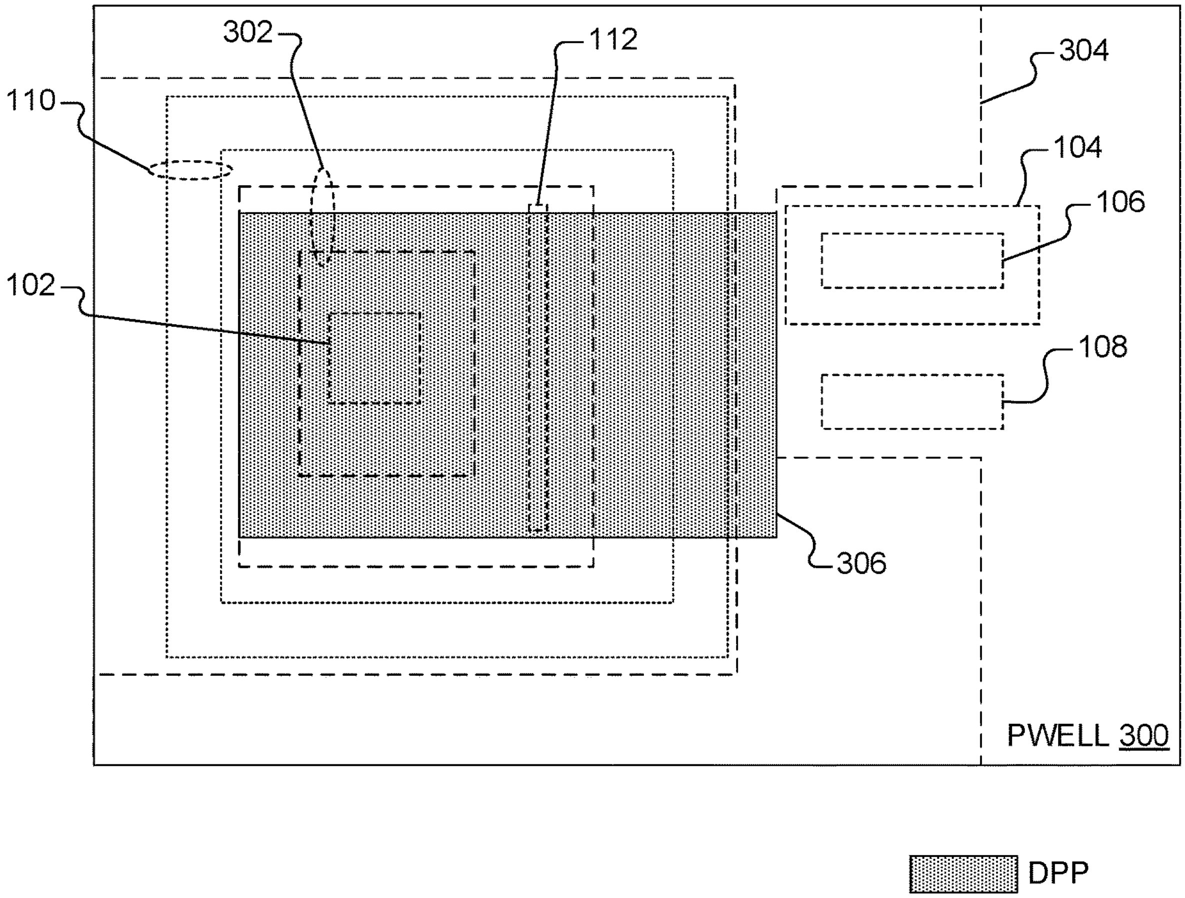
FIG. 4 is a top view of the exemplary portion of the PWELL of FIG. 3 of the IC shown in phantom but including a top view of the DPP implant implemented according to one embodiment.

FIG. 3 is a simplified block diagram of a top view and corresponding cross-sectional side view looking along line A-A of the top view of an exemplary portion of a CMOS P-type substrate (shown as PWELL) 300 of an IC configured with latch-up protection implemented according to another embodiment. The PWELL 300 is fabricated with substantially similar formations as the PWELL 100, including the NP region 102 (EMITTER, E), the NWELL 104 including the PP region 106 (ANODE), the NP region 108 (CATHODE), the guard-ring 110 including the NWELL 114 and NP region 116, and the well tie 112. The PWELL 300 also includes an application of a deep LPP implant 302 with a degenerate level of doping, another deep LPP implant 304 with a degenerate level of doping on either side of the guard-ring 110 extending in the area between the EMITTER and the ANODE and CATHODE, along with a deep PP (DPP) implant 306 that extends along the bottom portion of the PWELL 300. FIG. 4 shows additional detail of the DPP implant 306 according to one embodiment. Although the LPP implants 302 and 304 are shown using generally rectangular shapes and rectilinear boundaries for simplicity of illustration, it is noted that the LPP implants 302 and 304 may be formed with alternative shapes with curvilinear boundaries and the like.

In this case, the LPP implant 302 encompasses the well tie 112 and is enlarged and extended into a ring that surrounds the NP region 102 without touching the NP region 102. The LPP implant 302 is a well-tie extension of the well tie 112 that reduces the propensity of latch-up. In addition, the LPP implant 302 has a deep implant profile similar to the LPP implant 202 that extends all the way down to overlap the DPP implant 306, and may thus be deeper than the NWELL 114. The combination of the LPP implant 302 and the DPP implant 306 is also a well-tie extension that reduces the propensity of latch-up. The LPP implant 304 extends above and below the guard-ring 110 and between the guard-ring 110 and the NWELL 104 of the ANODE and the NP region 108 (CATHODE) without actually touching any of these other formations. The LPP implant 304 may also be considered a well-tie extension. Although not shown, the LPP implant 304 may be extended on the left-side to enclose without touching the guard-ring 110. In addition, the LPP implant 304 has a deep implant profile similar to the LPP implant 302, in which all or a sufficient or significant portion of the LPP implant 302 extends all the way down to overlap the DPP implant 306. The combination of the LPP implants 302 and 304 and the DPP implant 306 also forms a well-tie extension that reduces the propensity of latch-up. It is noted that the NWELL 114 of the guard-ring 110 does not extend down to overlap the DPP implant 306, in which these formations do not touch each other.

It is appreciated that the PWELL 300 is configured with the guard-ring 110 and the well tie 112. The addition of the LPP implants 302 and 304 and the DPP implant 306, however, extends the well tie to enable further relaxation of the minimum-distance requirement between the EMITTER (NP region 102) and the ANODE and CATHODE (the PP and NP regions 106 and 108, respectively). The increased dopant level by inclusion of the LPP implants 302 and 304 and the DPP implant 306 increases recombination rates, which reduces the injected current of the EMITTER that reaches latch-up trigger regions formed by the ANODE and CATHODE. In essence, the hot zone around the EMITTER is reduced allowing closer positioning of potential trigger regions. Thus, the minimum-distance requirement from the EMITTER is reduced from the conventional distance d1 to a smaller distance d3, in which d3<d1. The inclusion of the guard-ring 110 partially constrains additional reduction of d3. However, further relaxation of the minimum-distance requirement between the ANODE and CATHODE is achieved. The minimum-distance requirement between the ANODE and CATHODE may also be reduced from the conventional distance s1 to a smaller distance s3, in which s3<s1. It is also noted that the distance s3 shown in FIG. 3 is smaller than the distance s2 shown in FIG. 2, or s3<s2.

FIG. 4 is a top view of the exemplary portion of the PWELL 300 of the IC shown in phantom but including a top view of the DPP implant 306 implemented according to one embodiment. Only the outlines of the NP region 102, the NWELL 104, the PP region 106, the NP region 108, the guard-ring 110, the well tie 112, the LPP implant 302, and the LPP implant 304 are shown to illustrate relative positioning. The DPP implant 306 is shown with an exemplary area (length and width) extending in both directions to overlap portions of the LPP implants 302 and 304. The area of the DPP implant 306 may be modified in either direction so long as it overlaps a sufficient amount of area of the LPP implants 302 and 304 to reduce the hot zone and thus to prevent latch-up for the given locations of the EMITTER relative to the ANODE and CATHODE.

Figure 5:
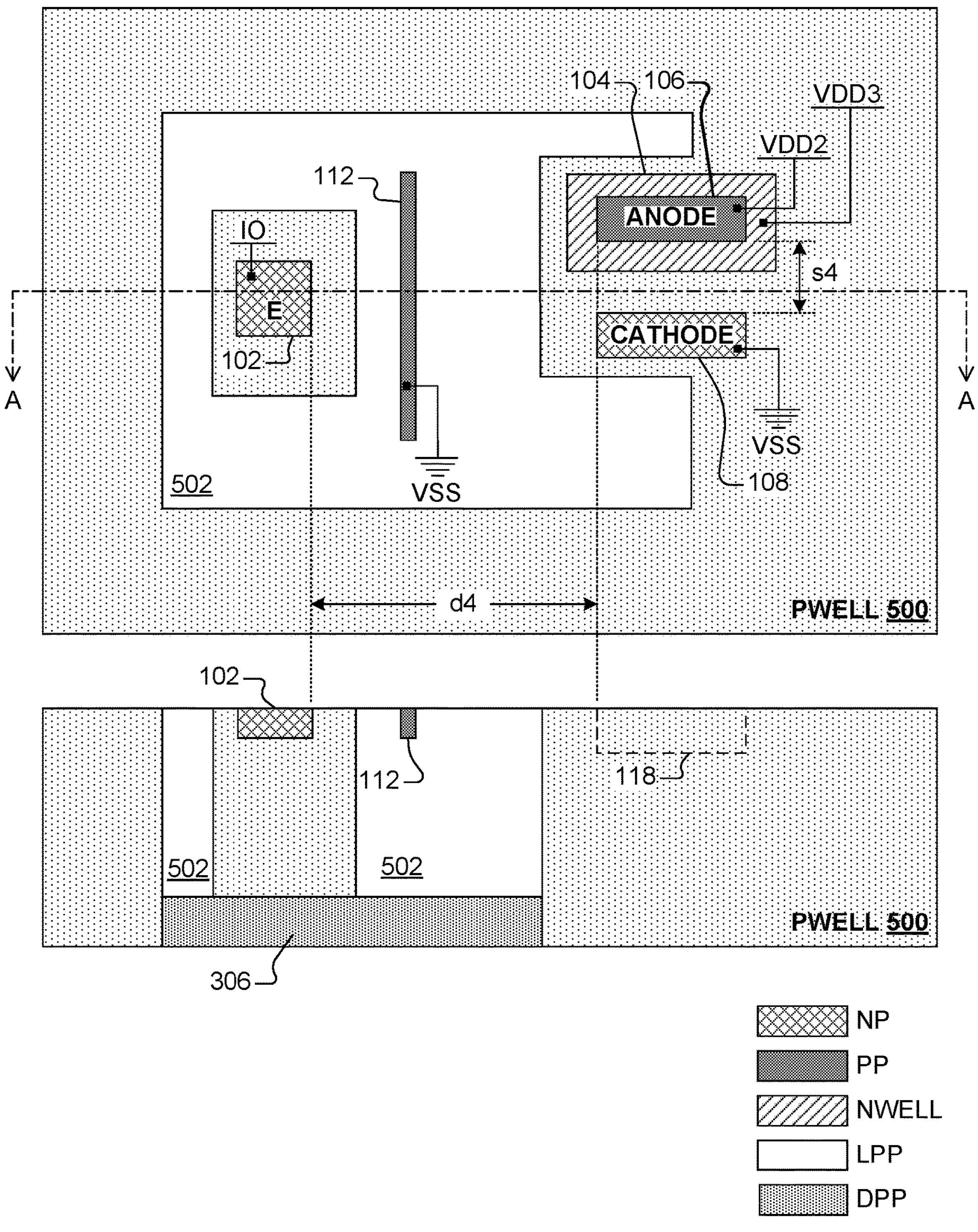
FIG. 5 is a simplified block diagram of a top view and corresponding cross-sectional side view looking along line A-A of the top view of an exemplary portion of a CMOS P-type substrate (shown as PWELL) of an IC configured with latch-up protection implemented according to yet another embodiment.

FIG. 5 is a simplified block diagram of a top view and corresponding cross-sectional side view looking along line A-A of the top view of an exemplary portion of a CMOS P-type substrate (shown as PWELL) 500 of an IC configured with latch-up protection implemented according to yet another embodiment. The PWELL 500 is fabricated with similar formations as the PWELL 300, including the NP region 102 (EMITTER, E), the NWELL 104 including the PP region 106 (ANODE), the NP region 108 (CATHODE), and the well tie 112. The conventional guard-ring 110, however, is removed in its entirety. In this case, the PWELL 500 includes an application of a deep LPP implant 502 with a degenerate level of doping, which is substantially similar to a formation that effectively merges together the LPP implants 302 and 304. The DPP implant 306 is included in substantially the same manner as shown and described in FIGS. 3 and 4 according to one embodiment. The LPP implant 502 extends down to overlap substantial portions of the DPP implant 306 in a similar manner as previously described.

The LPP implant 502 again extends the well tie 112 by encompassing the well tie 112 and surrounds the NP region 102 without touching the NP region 102. In addition, the LPP implant 502 has a deep implant profile, similar to that described for the LPP implants 302 and 304, that extends all the way down to overlap the DPP implant 306. The combination of the LPP implant 502 and the DPP implant 306 forms a well-tie extension that reduces the propensity of latch-up. The LPP implant 502 between the well tie 112 and the NWELL 104 of the ANODE and the NP region 108 (CATHODE) without actually touching any of these other formations. Also, a sufficient or significant portion of the LPP implant 502 extends all the way down to overlap the DPP implant 306. Although the LPP implant 502 is shown using generally rectangular shapes and rectilinear boundaries for simplicity of illustration (similar to that shown for the LPP implants 302 and 304), it is noted that the LPP implant 502 may also be formed using alternative shapes with curvilinear boundaries and the like.

The removal of the guard-ring 110 and the addition of the LPP implant 502 and the DPP implant 306 to extend the well tie 112 enables even further relaxation of the minimum-distance requirement between the hot zone of the EMITTER (NP region 102) and potential trigger regions including, for example, the ANODE and CATHODE (the PP and NP regions 106 and 108, respectively). The increased dopant level by inclusion of the LPP implant 502 and the DPP implant 306 increases recombination rates which reduces the injected current that reaches latch-up trigger regions. In essence, the hot zone around the EMITTER is reduced enabling closer spacing of trigger regions. Thus, the minimum-distance requirement from the EMITTER is reduced from the conventional distance d1 to a smaller distance d4, in which d4<d1. Also, the removal of the guard-ring 110 enables further reduction of the distance such that d4<d3. Also, the minimum-distance requirement between the ANODE and CATHODE is reduced from the conventional distance s1 to a smaller distance s4, in which s4<s3<s1 in a similar manner as shown in FIG. 3.

Figure 6:
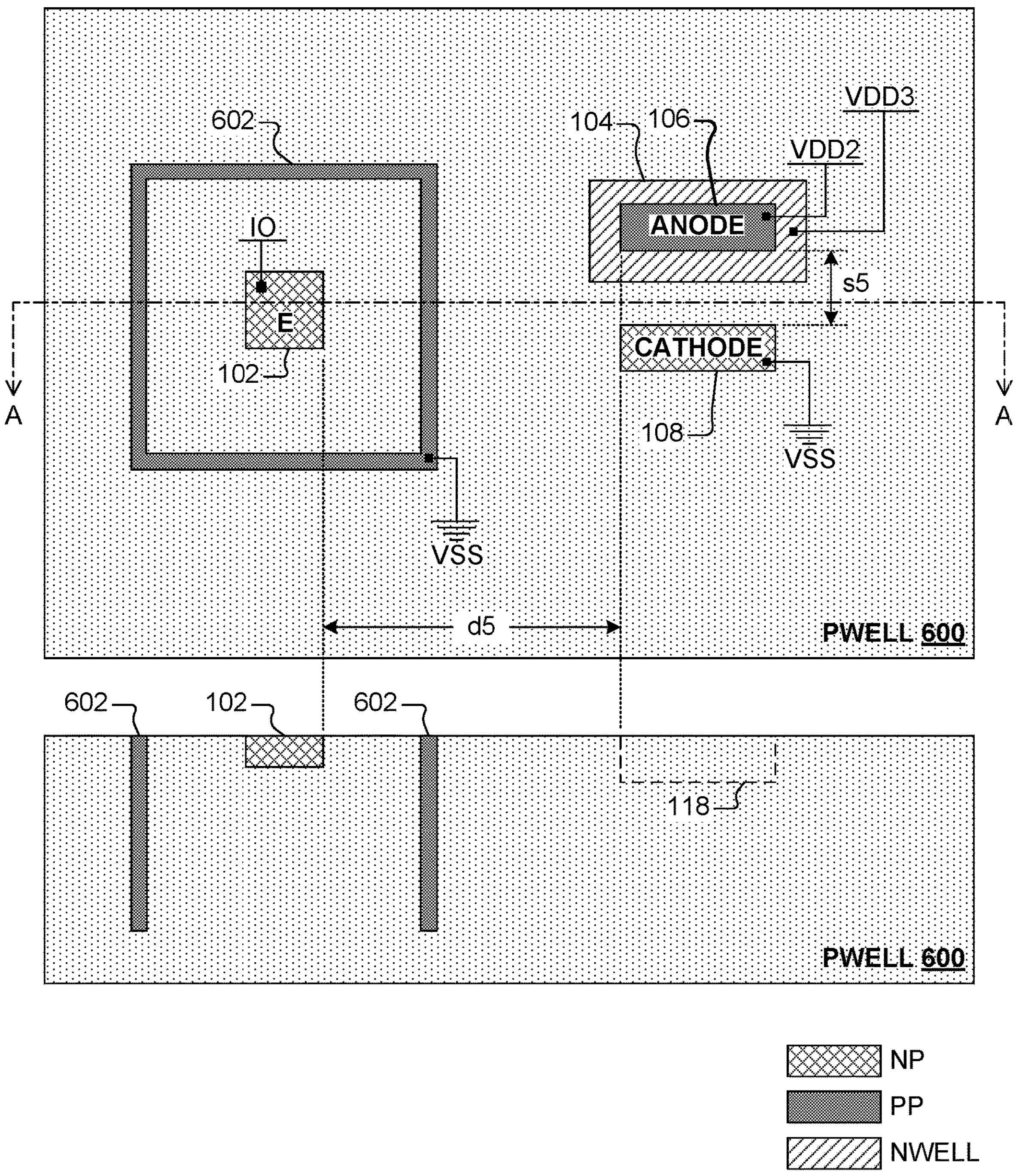
FIG. 6 is a simplified block diagram of a top view and corresponding cross-sectional side view looking along line A-A of the top view of an exemplary portion of a CMOS P-type (shown as PWELL) of an IC configured according to still another embodiment.

FIG. 6 is a simplified block diagram of a top view and corresponding cross-sectional side view looking along line A-A of the top view of an exemplary portion of a CMOS P-type (shown as PWELL) 600 of an IC configured according to still another embodiment. The PWELL 600 is fabricated with similar formations as the PWELL 500, including the NP region 102 (EMITTER, E), the NWELL 104 including the PP region 106 (ANODE), and the NP region 108 (CATHODE). The conventional guard-ring 110 is removed in its entirety. Also, the LPP and DPP implants are not included. The well tie 112 with heavier doping is extended into a deep-profile PP implant 602 that rings or otherwise surrounds the EMITTER without touching the EMITTER structure in a similar manner as the guard-ring 110. The PP implant 602 may be fabricated closer to the EMITTER and is coupled to VSS in a similar manner as the well tie 112. The PP implant 602 also has a deep profile similar to the LPP implant structures (202, 302, 304, 502) previously described. The PP implant 602 forms a well-tie extension of the well tie 112 that reduces the propensity of latch-up as compared to the well tie 112 without extension.

The PP implant 602 forms a wall of implants around existing well ties with a degenerate level of doping to effectively create a conductive column surrounding the EMITTER. Although the PP implant 602 is shown with a rectangular or square shape with rectilinear boundaries for simplicity of illustration, it is noted that the PP implant 602 may also be formed using alternative shapes with curvilinear boundaries and the like. The PP implant 602 effectively acts as a collector guard-ring where all minority carriers generated during operation reaching the conductive column formed by the PP implant 602 recombine. The removal of the guard-ring 110 and the addition of the PP implant 602 effectively extending the well tie 112 deeper within the PWELL 600 enables significant relaxation of the minimum-distance requirement between the hot zone formed by the EMITTER (NP region 102) and the trigger regions formed by the ANODE and CATHODE (the PP and NP regions 106 and 108, respectively). In essence, the hot zone around the EMITTER is reduced enabling closer positioning of potential trigger regions including the ANODE and CATHODE. Thus, the minimum-distance requirement from the EMITTER is reduced from the conventional distance d1 to a smaller distance d5, in which d5<d1. Also, the minimum-distance requirement between the ANODE and CATHODE is reduced from the conventional distance s1 to a smaller distance ds5, in which s5<s1 in a similar manner as shown in FIGS. 3 and 5.

In each of the embodiments shown and described, the reduced size of the hot zone around the exemplary EMITTER formed on the PWELL substrate (e.g., PWELLs 200, 300, and 500) enables surrounding structures, such as ANODEs and CATHODEs that might otherwise act as latch-up trigger regions, to be located closer to the EMITTER structure. In addition, the surrounding structures may be located closer to each other without increasing latch-up potential. The illustrated implant structures may be extended across the entire substrate of the IC, thereby reducing the hot zones of many up to all EMITTERs, which significantly increases the available space of the IC while providing substantially the same level or even an enhanced level of latch-up protection. This, in turn, provides more room for additional circuitry, may help reduce circuit or die area, or otherwise relaxes the space requirements of existing circuitry of the IC.

It is noted that latch-up prevention with selective well doping as described herein equally applies to structures with reversed polarities or conductivity types. In the illustrated figures, the underlying substrate, the well ties, the ANODE, and the lateral and deep implants were shown as implemented as P-type structures (e.g., PWELL, PP, LPP, DPP, etc.) which may be referred to as a first conductivity type (e.g., P-type), whereas the EMITTER, the guard-ring 110, the ANODE well, and the CATHODE were shown implemented as N-type structures (e.g., NWELL, NP) which are of a second conductivity type (e.g., N-type).

The conductivity types may be reversed without departing from the spirit and scope of the present disclosure. Thus, the underlying substrate, the well ties, the ANODE, and the lateral and deep implants may instead be implemented as N-type structures (e.g., NWELL, NP, LNN, DNN, etc.) which may be referred to as the first conductivity type (e.g., N-type), whereas the EMITTER, the guard-ring, the ANODE well, and the CATHODE may instead be implemented as P-type structures (e.g., PWELL, PP) which are of a second conductivity type (e.g., P-type). In other words, the first conductivity type may be P-type or N-type, whereas the second conductivity type is thus N-type or P-type, respectively.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A CMOS circuit, comprising:

a substrate of a first conductivity type with an emitter of a second conductivity type formed on a surface of the substrate;

a well tie of the first conductivity type formed between the emitter and at least one trigger region and comprising a strip of heavier doping for coupling to a supply-voltage reference; and a well-tie extension comprising a deep lateral implant of the first conductivity type that overlaps at least a portion of the well tie, wherein the deep lateral implant of the first conductivity type comprises a degenerate level of doping that encompasses the well tie and that forms a guard-ring that surrounds the emitter.

2. The CMOS circuit of claim 1, further comprising a deep implant of the first conductivity type formed at a lower portion of a body of the substrate that overlaps at least a portion of a lower extent of the deep lateral implant.

3. The CMOS circuit of claim 1, wherein the deep lateral implant of the first conductivity type comprises a degenerate level of doping.

4. The CMOS circuit of claim 1, further comprising a deep implant of the first conductivity type formed at a lower portion of a body of the substrate that overlaps at least a portion of a lower extent of the deep lateral implant.

5. The CMOS circuit of claim 1, further comprising a first guard-ring of the second conductivity type surrounding the emitter and the well tie, wherein the guard-ring comprises a deep well portion with lighter doping extending within a body of the substrate and a shallow implant profile formed within the well portion with heavier doping for coupling to a supply voltage.

6. The CMOS circuit of claim 5, further comprising:
a deep implant of the first conductivity type formed at a lower portion of the body of the substrate; and
wherein the deep lateral implant of the first conductivity type encompasses the well tie and forms a second guard-ring surrounding the emitter within the first guard-ring that overlaps at least a portion of an upper extent of the deep implant.

7. The CMOS circuit of claim 5, further comprising:
wherein the deep lateral implant of the first conductivity type comprises a first deep lateral implant of the first conductivity type with a degenerate level of doping that encompasses the well tie and that forms a second guard-ring that surrounds the emitter within the first guard-ring; and
a second deep lateral implant of the first conductivity type with a degenerate level of doping at least partially surrounds without touching the first guard-ring and formed between the first guard-ring and at least one latch-up trigger location.

8. The CMOS circuit of claim 7, further comprising a deep implant of the first conductivity type formed at a lower portion of the body of the substrate that overlaps at least a portion of a lower extent of the first deep lateral implant and the second deep lateral implant.

9. The CMOS circuit of claim 1, wherein the well tie and well-tie extension collectively comprise a guard-ring implant of the first conductivity type with heavier doping and with a deep profile surrounding without touching the emitter.

10. A method of providing latch-up immunity for a CMOS circuit, the CMOS circuit comprising a substrate of a first conductivity type and an emitter of a second conductivity type formed on a surface of the substrate, the method comprising:
providing a well tie of the first conductivity type between the emitter and at least one trigger region and comprising a strip of heavier doping for coupling to a supply-voltage reference; and
extending the well tie with a deep lateral implant of the first conductivity type that overlaps at least a portion of the well tie, wherein the extending the well tie comprises extending the well tie with the deep lateral implant of the first conductivity type with a degenerate level of doping that encompasses the well tie and that forms a guard-ring that surrounds without touching the emitter.

11. The method of claim 10, further comprising providing a deep implant of the first conductivity type at a lower portion of a body of the substrate that overlaps at least a portion of a lower extent of the deep lateral implant.

12. The method of claim 10, wherein the extending the well tie comprises extending the well tie with the deep lateral implant of the first conductivity type with a degenerate level of doping.

13. The method of claim 10, further comprising providing a deep implant of the first conductivity type at a lower portion of a body of the substrate that overlaps at least a portion of a lower extent of the deep lateral implant.

14. The method of claim 10, further comprising providing a first guard-ring of the second conductivity type surrounding the emitter and the well tie, wherein the guard-ring comprises a deep well portion with lighter doping extending within a body of the substrate and a shallow implant profile formed within the well portion with heavier doping for coupling to a supply voltage.

15. The method of claim 14, further comprising:
providing a deep implant of the first conductivity type at a lower portion of the body of the substrate; and
wherein the extending the well tie comprises extending the well tie with the deep lateral implant of the first conductivity type that encompasses the well tie and forms a second guard-ring surrounding the emitter within the first guard-ring and overlapping at least a portion of an upper extent of the deep implant.

16. The method of claim 14, further comprising:
wherein the extending the well tie comprises extending the well tie with a first deep lateral implant of the first conductivity type with a degenerate level of doping that encompasses the well tie and that forms a second guard-ring surrounding the emitter within the first guard-ring; and
providing a second deep lateral implant of the first conductivity type with a degenerate level of doping at least partially surrounding without directly interfacing the first guard-ring and formed between the first guard-ring and at least one latch-up trigger location.

17. The method of claim 16, further comprising providing a deep implant of the first conductivity type at a lower portion of the body of the substrate that overlaps at least a portion of a lower extent of the first deep lateral implant and the second deep lateral implant.

18. The method of claim 10, wherein the extending the well tie comprises extending the well tie with heavier doping to form a guard-ring implant of the first conductivity type with a deep profile surrounding without touching the emitter.

* * * * *